United States Patent [19]

Colvin, Sr.

[11] Patent Number: 5,245,229
[45] Date of Patent: Sep. 14, 1993

[54] DIGITALLY CONTROLLED INTEGRATED CIRCUIT ANTI-CLIPPING MIXER

[75] Inventor: Bryan J. Colvin, Sr., San Jose, Calif.

[73] Assignee: Media Vision, Fremont, Calif.

[21] Appl. No.: 843,045

[22] Filed: Feb. 28, 1992

[51] Int. Cl.$^5$ .................. G06G 7/16; H03K 5/22; H03F 1/00

[52] U.S. Cl. .................. 307/529; 307/493; 307/498; 328/158; 330/86; 330/144; 330/282; 330/284

[58] Field of Search .................. 307/493, 498, 529; 328/158, 159; 330/147, 69, 86, 144, 145, 282, 284

[56] References Cited

U.S. PATENT DOCUMENTS

| | | | |
|---|---|---|---|
| 3,412,339 | 11/1968 | Koning | 307/493 |
| 3,551,824 | 12/1970 | Rotier | 307/498 |
| 3,921,080 | 11/1975 | Hardy | 328/158 |
| 4,070,632 | 1/1978 | Tuttle | 330/86 |
| 4,110,708 | 8/1978 | Mendenhall | 330/86 |
| 4,132,957 | 1/1979 | Hekimian et al. | 330/282 |
| 4,306,202 | 12/1981 | Schroder | 330/284 |
| 4,328,465 | 5/1982 | Takaoka et al. | 330/284 |
| 4,500,845 | 2/1985 | Ehni | 330/284 |
| 4,509,021 | 4/1985 | van Uden | 330/284 |
| 4,628,276 | 12/1986 | Mizutani | 330/282 |
| 4,667,304 | 5/1987 | Hier et al. | 364/825 |
| 4,760,346 | 7/1988 | Kultgen et al. | 330/69 |
| 4,855,685 | 8/1989 | Hochschild | 330/282 |
| 4,859,936 | 8/1989 | Eccleston | 324/130 |
| 4,933,631 | 6/1990 | Eccleston | 324/130 |
| 5,061,866 | 10/1991 | El-Naggar et al. | 307/529 |

FOREIGN PATENT DOCUMENTS 0720425  3/1980  U.S.S.R. .................. 307/493

OTHER PUBLICATIONS

Sedra et al., "Microelectronic Circuits", 1982, pp. 76–77.

*Primary Examiner*—John Zazworsky
*Assistant Examiner*—Terry D. Cunningham
*Attorney, Agent, or Firm*—Skjerven, Morrill, MacPherson, Franklin & Friel

[57] ABSTRACT

An anti-clipping mixer circuit is provided within an integrated circuit. The mixer circuit allows for the independent level control of each input signal, thereby allowing the optimization of the signal-to-noise ratio. A master level control is provided to limit the overall combined output signal to a level below the operational amplifier's maximum voltage level. A control circuit may be used to automatically adjust the input signal levels as well as the combined output signal level.

2 Claims, 2 Drawing Sheets

DIGITALLY CONTROLLED INTEGRATED CIRCUIT ANTI-CLIPPING MIXER

BACKGROUND OF THE INVENTION

1. Field of the Invention

This invention relates to integrated circuits and more particularly to anti-clipping mixer circuits.

2. Description of the Relevant Art

Mixer circuits are well known for combining a plurality of input signals such as audio signals and providing an output signal indicative of the combination of input signals. In a typical circuit configuration, the plurality of input signals are provided through separate resistive paths to the input of an operational amplifier. The operational amplifier is provided with a resistive feedback path having an adjustable resistance to adjust the overall gain of the mixer circuit.

When designing a mixer circuit with discreet components, the operational amplifier can be chosen such that the combined input signals do not exceed a maximum-rated voltage level of the operational amplifier. In addition, the variable feedback resistance can be adjusted to reduce the overall output voltage of the combined signals. By selecting the appropriate operational amplifier and by adjusting the feedback resistance properly, clipping of the output signal can be prevented while maintaining a relatively high signal-to-noise ratio.

Problems arise, however, if such a mixer circuit is fabricated on a digital integrated circuit. Within the digital integrated circuit environment, the maximum voltage level is typically limited to approximately ±5 volts. Therefore, the input signals provided to the input resistive elements must have relatively low levels to assure that the maximum voltage of the operational amplifier is not exceeded. Unfortunately, this results in a poor signal-to-noise ratio.

SUMMARY OF THE INVENTION

In accordance with the present invention, an anti-clipping mixer circuit is provided within an integrated circuit. The mixer circuit allows for the independent level control of each input signal, thereby allowing the optimization of the signal-to-noise ratio. A master level control is provided to limit the overall combined output signal to a level below the operational amplifier's maximum voltage level. A control circuit may be used to automatically adjust the input signal levels as well as the combined output signal level.

These and other advantages are achieved by the present invention, in accordance with which a mixer circuit fabricated on an integrated circuit comprises an operational amplifier having first and second input lines and an output line, and a master level control including a variable resistive element connected between the first input line and the output line of the operational amplifier. The mixer circuit further comprises a plurality of variable input resistive elements, each connected to the operational amplifier and to a separate input terminal, each of the plurality of variable input resistive elements for receiving one of a plurality of input signals to be mixed. A control circuit may further be provided for controlling the resistance of the master level control and the resistances of the variable input resistive elements.

The invention will be more readily understood with reference to the drawings and the detailed description. As will be appreciated by one skilled in the art, the invention is applicable to integrated mixer circuitry in general, and is not limited to the specific embodiment disclosed.

DETAILED DESCRIPTION

The following includes a detailed description of the best presently contemplated mode for carrying out the invention. The description is intended to be merely illustrative of the invention and should not be taken in a limiting sense.

Figure 1:
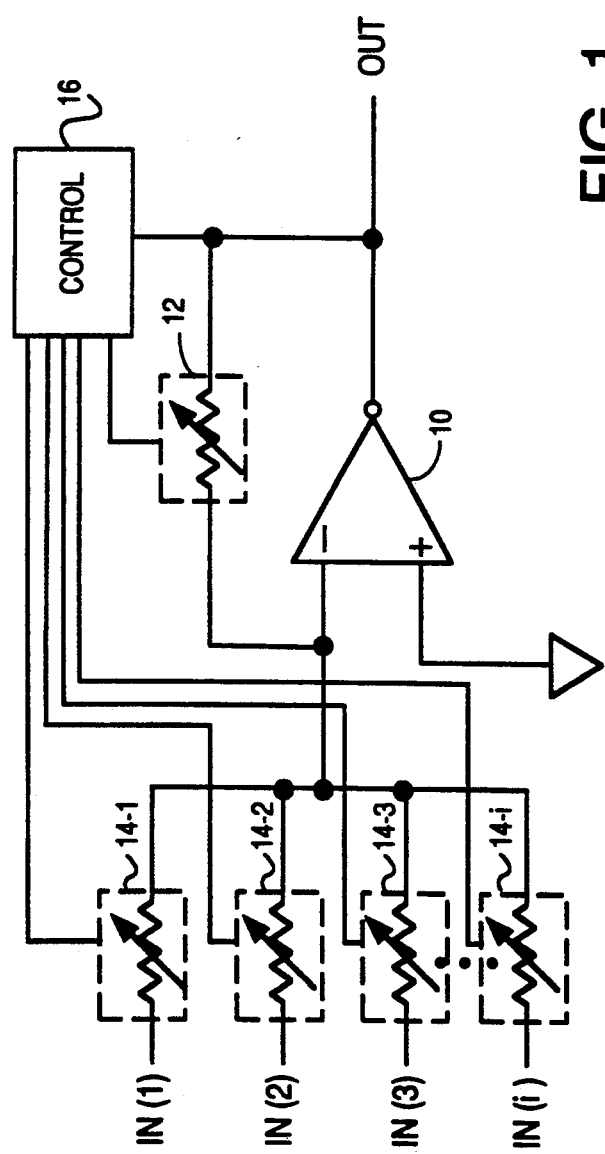
FIG. 1 is a schematic diagram of a mixer circuit fabricated on an integrated circuit in accordance with the present invention.

Referring to FIG. 1, a schematic diagram is shown of a mixer circuit according to the present invention. The mixer circuit is fabricated on an integrated circuit chip and includes an operational amplifier 10 and an adjustable master level control 12. The master level control 12 is connected between the inverting input line and the output line of operational amplifier 10. A plurality of variable input resistive elements 14-1 through 14-i are connected between the inverting input line of operational amplifier 10 and input terminals labelled In(1) through In(i), respectively.

The circuit of FIG. 1 mixes a plurality input signals received at input terminal In(1)–In(i) and provides a combined output signal at the OUT terminal. The master level control 12 is provided to adjust the voltage level of the combined output signal such that the maximum voltage level of the operational amplifier 10 is not exceeded. It is noted that since the mixer circuit is fabricated on a digital integrated circuit, the maximum (absolute value) voltage level of operational amplifier 10 is approximately 5 volts.

Each input signal is individually adjustable by input resistive elements 14-1 through 14-i such that the signal strength of each input signal can be maximized before mixing. As a result of the variable input resistive elements 14-1 through 14-i, each input signal can be adjusted to thereby maximize the signal-to-noise ratio of the combined output signal.

Figure 2:
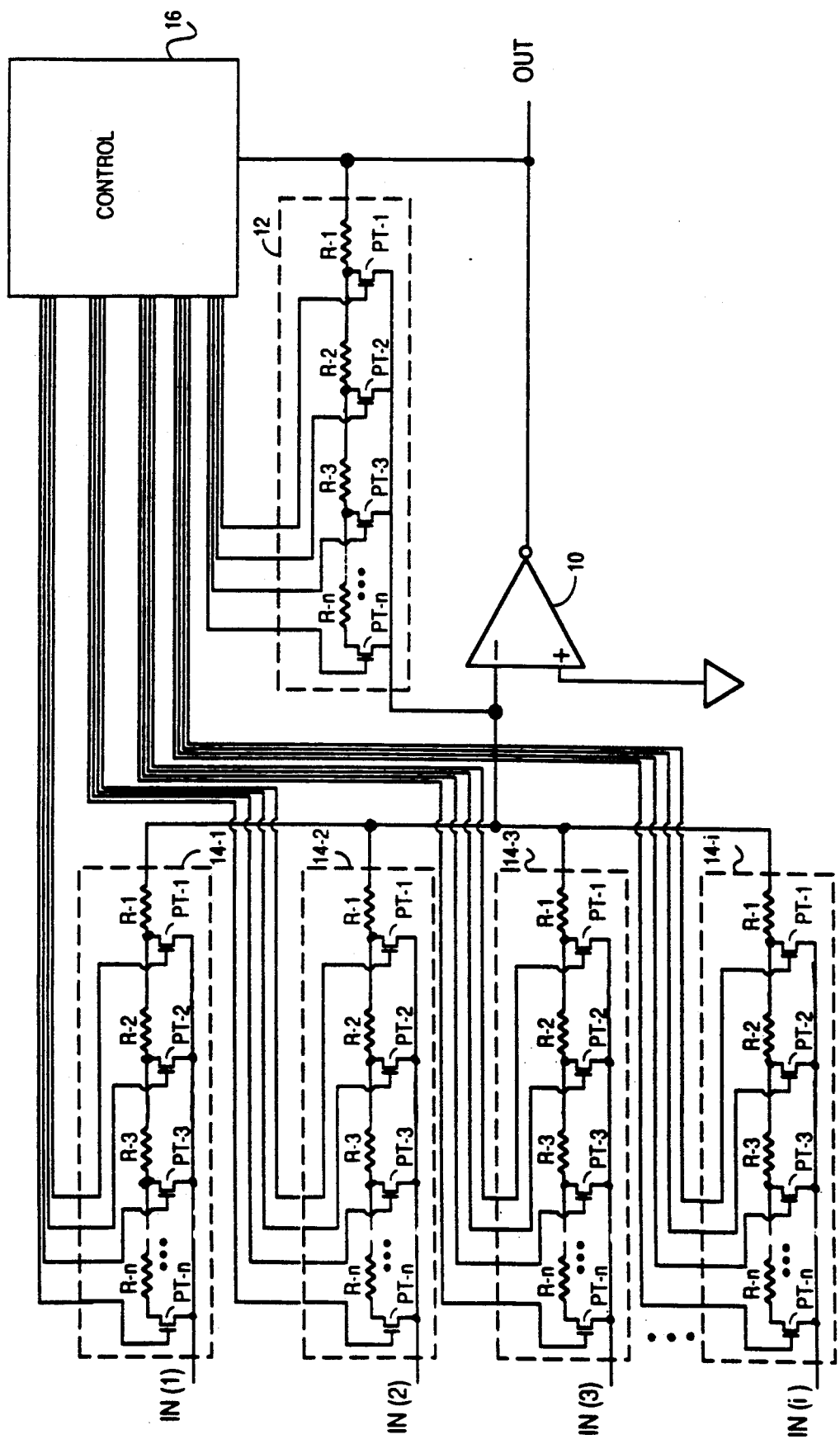
FIG. 2 is a schematic diagram of a mixer circuit in accordance with the present invention that includes digitally controlled resistive elements.

The master level control 12 and the input resistive elements 14-1 through 14-i are each implemented as digitally controlled resistors. As shown in FIG. 2, each of the digitally controlled resistors includes a plurality of pass transistors PT-1 through PT-n and a plurality of fixed resistive elements R-1 through R-n. The overall resistance of each digitally controlled resistor is determined by the particular pass transistor PT-1 through PT-n that is turned on.

Referring back to FIG. 1, the resistance value of the master level control 12 and the resistance values of the input resistive elements 14-1 through 14-i may be manually adjustable. Alternatively, as shown in FIG. 1, a control 16 may be provided to automatically adjust the resistance of the master level control 12 and/or the resistance of any one or more of the input resistive relatives 14-1 through 14-i. In the configuration of FIG. 1, the control 16 monitors the combined output signal at the OUT terminal and adjusts the resistance of the master level control, 12 and the resistance of each of the input resistive elements 14-1 through 14-i such that the signal-to-noise ratio is maximized.

As a result of a circuit in accordance with the present invention, the entire mixer circuitry can be fabricated on a single digital integrated circuit. Clipping of the combined output signal can be prevented while maintaining a relatively high signal-to-noise ratio.

Numerous modifications and variations will become apparent to those skilled in the art once the above disclosure is fully appreciated. For example, each of the variable resistive elements could be implemented using switching capacitors. It is to be understood that the above detailed description of the preferred embodiment is intended to be merely illustrative of the spirit and scope of the invention and should not be taken in a limiting sense. The scope of the claimed invention is better defined with reference to the following claims.

I claim:

1. A mixer circuit for mixing audio input signals, said mixer circuit being fabricated on an integrated circuit chip, comprising:

an operational amplifier having a first input lead, a second input lead, and an output lead;

a digitally controlled feedback resistance having a first terminal, a second terminal, and a control input lead, said first terminal being coupled to said first input lead of said operational amplifier, said second terminal being coupled to said output lead of said operational amplifier;

a plurality of digitally controlled input resistances, each of said digitally controlled input resistances having a first terminal, a second terminal, and a control input lead, each of said second terminals of said digitally controlled input resistances being coupled to said first input lead of said operational amplifier, each of said first terminals of said plurality of digitally controlled input resistances being coupled to a respective one of a plurality of sources of audio input signals; and a control circuit having an input lead and having a plurality of outputs leads, said input lead of said control circuit being coupled to said output lead of said operational amplifier, one of said output leads of said control circuit being coupled to said control input lead of said digitally controlled feedback resistance, each remaining one of said plurality of output leads of said control circuit being coupled to a respective one of said control input leads of said plurality of digitally controlled input resistances, said control circuit controlling said digitally controlled feedback resistance and said plurality of digitally controlled input resistances such that signal strengths of at least some of said plurality of said audio input signals are maximized and such that a signal on said output lead of said operational amplifier is not clipped.

2. The mixer circuit as recited in claim 1 wherein said control circuit generates a plurality of control signals in response to a signal on said output line, each of said plurality of control signals being output onto a respective one of said plurality of output leads of said control circuit.

* * * * *